(12) United States Patent
Iwamoto et al.

(10) Patent No.: US 9,197,184 B2
(45) Date of Patent: Nov. 24, 2015

(54) METHOD FOR MANUFACTURING PIEZOELECTRIC DEVICE

(75) Inventors: Takashi Iwamoto, Nagaokakyo (JP); Hajime Kando, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 940 days.

(21) Appl. No.: 13/309,626

(22) Filed: Dec. 2, 2011

(65) Prior Publication Data

US 2012/0073099 A1    Mar. 29, 2012

Related U.S. Application Data

(63) Continuation of application No. PCT/JP2010/057209, filed on Apr. 23, 2010.

(30) Foreign Application Priority Data

Jun. 9, 2009  (JP) ................................ 2009-138131

(51) Int. Cl.
*H03H 3/02* (2006.01)
*H01L 41/04* (2006.01)
(Continued)

(52) U.S. Cl.
CPC ................. *H03H 3/02* (2013.01); *H01L 41/04* (2013.01); *H01L 41/053* (2013.01); *H01L 41/0805* (2013.01); *H01L 41/31* (2013.01); *H01L 41/312* (2013.01); *H03H 3/06* (2013.01); *H03H 9/0523* (2013.01); *H03H 9/173* (2013.01);
(Continued)

(58) Field of Classification Search
CPC .............. H03H 3/02; H03H 2003/021; H03H 2003/023; H03H 2003/027; H03H 3/06; H03H 9/0523; H03H 9/173; Y10T 29/42; Y10T 29/49126; Y10T 29/49005; H01L 21/2007; H01L 21/304; H01L 41/04; H01L 41/053; H01L 41/0805; H01L 41/31; H01L 41/312

See application file for complete search history.

(56) References Cited

U.S. PATENT DOCUMENTS 6,100,166 A *  8/2000  Sakaguchi et al. ... H01L 21/2007
6,445,265 B1    9/2002  Wright
(Continued)

FOREIGN PATENT DOCUMENTS

JP    2002-534886 A    10/2002
JP    2005-342817 A    12/2005
(Continued)

OTHER PUBLICATIONS

Official Communication issued in International Patent Application No. PCT/JP2010/057209, mailed on Jul. 20, 2010.

*Primary Examiner* — A. Dexter Tugbang
(74) *Attorney, Agent, or Firm* — Keating & Bennett, LLP

(57) ABSTRACT

An ion implantation layer is formed in a piezoelectric single crystal substrate by implanting hydrogen ions. A lower electrode is formed on the surface of the piezoelectric single crystal substrate at a side at which the ion implantation layer is formed. A sacrificial layer is formed on the surface of the piezoelectric single crystal substrate at a side at which the ion implantation layer and the lower electrode are formed. The formation of the sacrificial layer is performed by direct formation thereof on the surface of the piezoelectric single crystal substrate, for example, by sputtering or coating. A support layer is formed on the piezoelectric single crystal substrate on which the sacrificial layer is formed, and after the surface of the support layer is planarized, a support base material is bonded thereto.

9 Claims, 6 Drawing Sheets

(51) Int. Cl.
*H03H 3/06* (2006.01)
*H01L 41/053* (2006.01)
*H01L 41/08* (2006.01)
*H01L 41/31* (2013.01)
*H01L 41/312* (2013.01)
*H03H 9/05* (2006.01)
*H03H 9/17* (2006.01)
*H01L 21/20* (2006.01)
*H01L 21/304* (2006.01)

(52) U.S. Cl.
CPC ........... *H01L21/2007* (2013.01); *H01L 21/304* (2013.01); *H03H 2003/021* (2013.01); *H03H 2003/023* (2013.01); *H03H 2003/027* (2013.01); *Y10T 29/42* (2015.01); *Y10T 29/49005* (2015.01); *Y10T 29/49126* (2015.01)

(56) References Cited

U.S. PATENT DOCUMENTS

2007/0199186 A1   8/2007  Yoshino et al.
2010/0052472 A1*  3/2010  Nishino et al. ........ H01L 41/312

FOREIGN PATENT DOCUMENTS

| JP | 2006228866 A | * | 8/2006 |
| JP | 2006-339749 A | | 12/2006 |
| JP | 2007-228319 A | | 9/2007 |
| JP | 2008078328 A | * | 4/2008 |
| JP | 2008-282567 A | | 11/2008 |

* cited by examiner

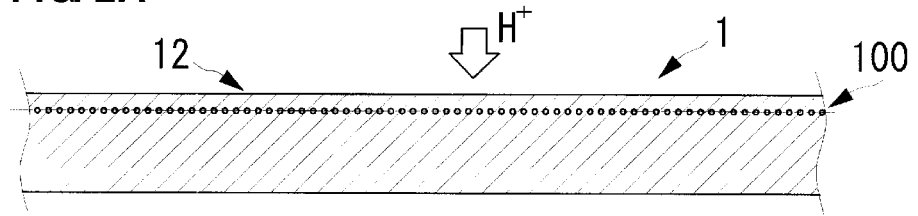
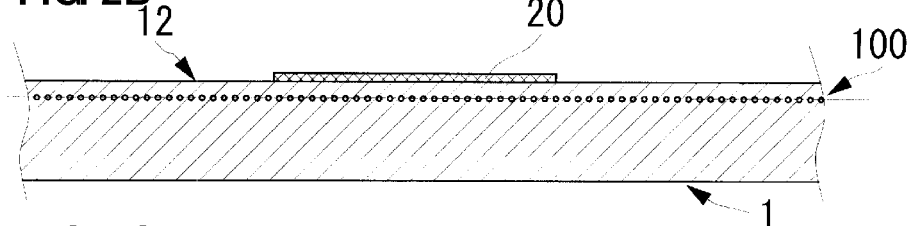
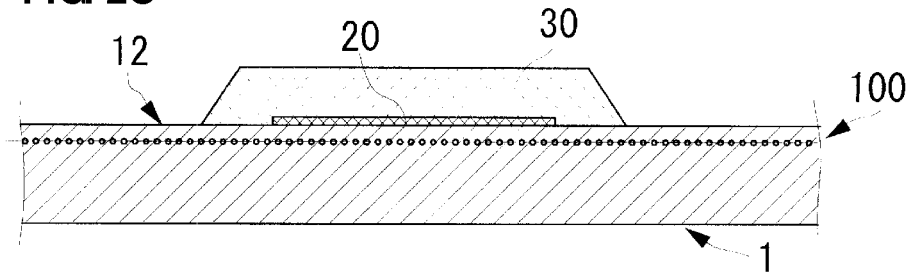
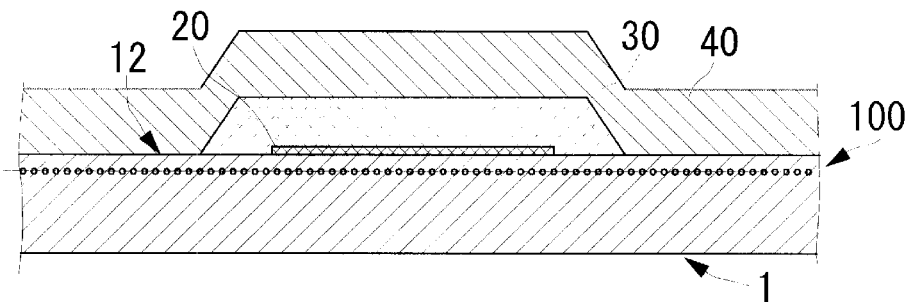
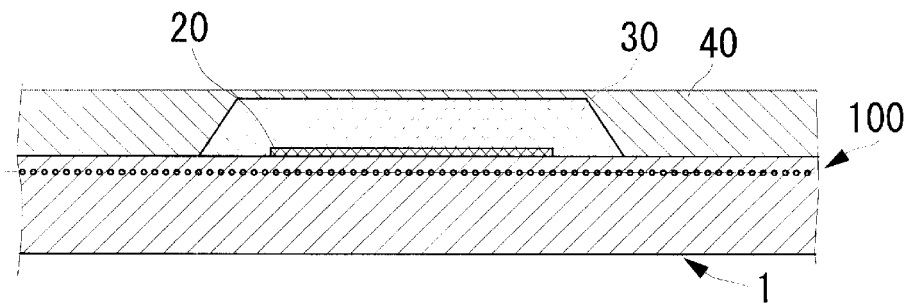

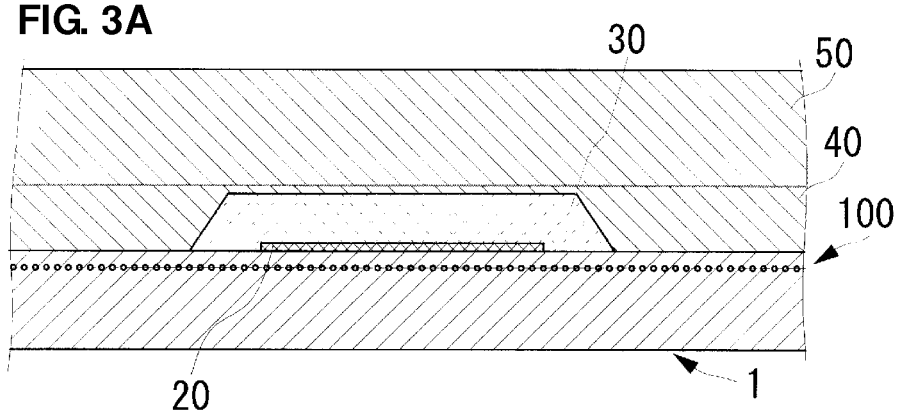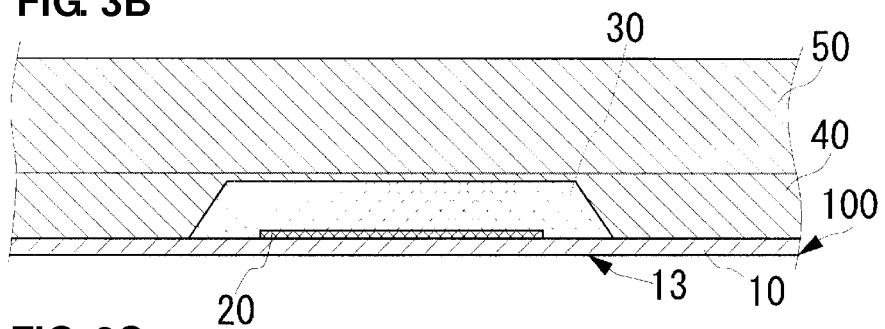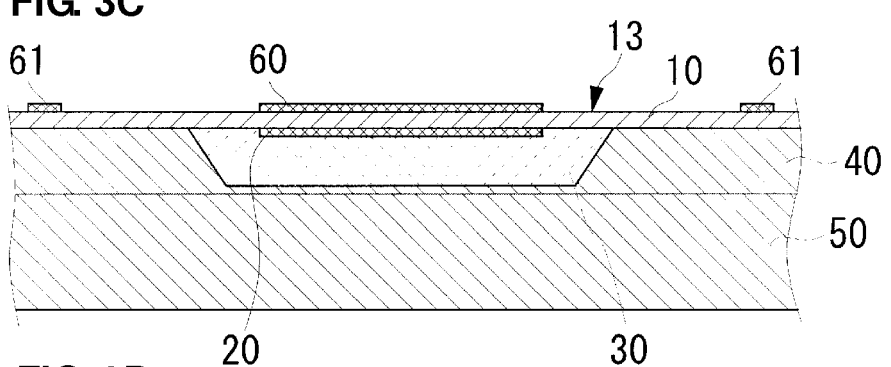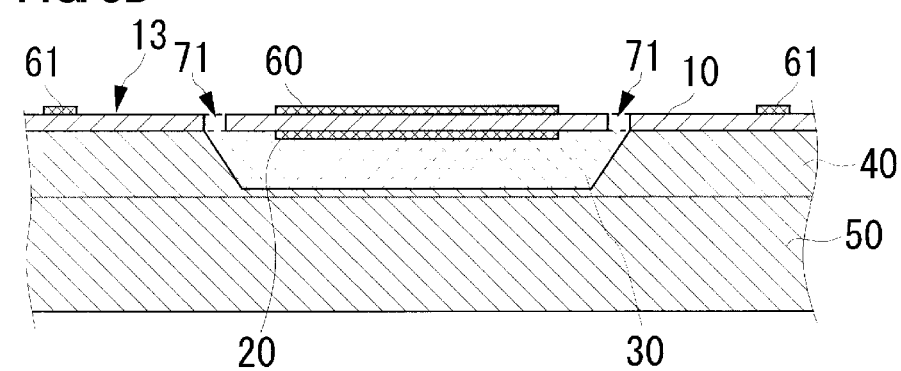

METHOD FOR MANUFACTURING PIEZOELECTRIC DEVICE

BACKGROUND OF THE INVENTION

1. Field of the Invention

The present invention relates to a method for manufacturing a piezoelectric device which uses a thin film of a piezoelectric single crystal, and more particularly, to a method for manufacturing a piezoelectric device having a membrane structure.

2. Description of the Related Art

Many piezoelectric devices formed from a thin film of a piezoelectric single crystalline substance have been developed. In a piezoelectric device formed by using a piezoelectric thin film as described above, a support member supporting the piezoelectric thin film is necessary in practical use. In addition, the support member as described above, is arranged on one primary surface of the piezoelectric thin film as disclosed in Japanese Unexamined Patent Application Publication No. 2007-228319 and Japanese Unexamined Patent Application Publication No. 2002-534886. In the configuration described above, a structure in which the support member is arranged on an approximately entire region of one primary surface and a structure in which the support member is not arranged only in a region functioning as the piezoelectric device but is arranged only in a region not functioning as the piezoelectric device have been provided. The structure in which the support member is arranged only in a region not functioning as this piezoelectric device is a membrane structure.

As a method for forming this membrane structure, in the past, there has been a method in which after being bonded to the entire primary surface of a piezoelectric substance, a support member arranged in a region functioning as a piezoelectric device is removed by etching or the like.

However, in the method performed by the removal as described above, it is not easy to completely remove the support member only in a necessary region without imparting an adverse influence on the piezoelectric substance. For this reason, as disclosed in Japanese Patent Application No. 2008-282567, a method is disclosed in which, after a recess portion is provided in a support member, and a sacrificial layer material, which can be easily removed, is filled in the recess portion, the supporting member is bonded to a piezoelectric substance so that the sacrificial layer material faces a functional portion of the piezoelectric substance, and after the bonding, the sacrificial layer material is removed. With the method described above, a hollow membrane structure can be more easily achieved as compared to that in the past.

However, since the support member and the piezoelectric substance are pressed together with a high pressure in order to obtain a sufficient bonding force, in the method described above, if a bonding treatment is not performed after the flatness of a bonding plane of the support member in which the sacrificial layer material is filled is sufficiently ensured, the surface of the piezoelectric substance receives a large stress directly from a projection portion of the support member during the bonding, and crystalline destruction of the piezoelectric substance occurs. Thus, the possibility of degradation in the operation of the piezoelectric device cannot be completely eliminated.

SUMMARY OF INVENTION

To overcome the problems described above preferred embodiments of the present invention provide a method for manufacturing a piezoelectric device which can easily form a membrane structure and also which can reliably prevent crystalline destruction generated in a functional portion of the piezoelectric device.

A preferred embodiment of the present invention provides a method for manufacturing a piezoelectric device including a piezoelectric thin film and a support member supporting the piezoelectric thin film, the method preferably includes at least an ion implantation step, a sacrificial layer formation step, a support member formation step, a peeling step, and a sacrificial layer removal step.

The ion implantation step is preferably a step of forming an ion implantation layer by implanting ions in a piezoelectric substrate. The sacrificial layer formation step is preferably a step of forming a sacrificial layer on the surface of the piezoelectric substrate at an ion implantation layer side, for example, by vacuum film formation. The support member formation step is preferably a step of forming a support member on the surface of the piezoelectric substrate at the ion implantation layer side. The peeling step is preferably a step of forming a piezoelectric thin film by peeling a portion of the piezoelectric substrate in which the ion implantation layer is formed. The sacrificial layer removal step is preferably a step of removing the sacrificial layer.

In the manufacturing method as described above, the sacrificial layer is preferably directly formed by vacuum film formation on the surface of the piezoelectric substrate at a side at which the piezoelectric thin film is formed. Accordingly, since a treatment in which a region defining a functional portion of the piezoelectric substrate and the sacrificial layer are bonded to each other is not performed, crystal destruction of the functional portion of the piezoelectric thin film is not generated.

In addition, in the method for manufacturing a piezoelectric device according to a preferred embodiment of the present invention, the support member formation step is preferably performed after the sacrificial layer formation step. In addition, the support member formation step preferably includes a support layer formation step of forming a support layer so as to cover the sacrificial layer and a support base material bonding step of bonding a support base material to the support layer.

In addition, after the sacrificial layer is formed as described above, and the support layer is formed so as to cover the sacrificial layer, the support base material may preferably be provided so as to be bonded only to the support layer. Therefore, a bonding treatment can be easily performed. In addition, since the bonding can be performed without performing a planarization treatment, which will be described later, to the position of the sacrificial layer, if the sacrificial layer can be stably formed, variations in properties of the piezoelectric device are prevented or minimized. That is, the number of manufacturing factors which cause the variations in properties is reduced, and thus, the variations in properties are easily prevented or minimized.

In addition, in the method for manufacturing a piezoelectric device according to a preferred embodiment of the present invention, the support member formation step preferably includes, before the sacrificial layer formation step, a support layer formation step of forming a support layer in a region other than the region in which the sacrificial layer is to be formed and, after the sacrificial layer formation step, a support base material bonding step of bonding a support base material to the sacrificial layer and the support layer.

In addition, in the case in which, after the support layer is formed so as not to be provided in a partial exclusion region as described above, the sacrificial layer is preferably formed, and the support base material is then bonded, when the surface of the support layer is used as a bonding plane, a hollow shape of a membrane can be stably formed. Accordingly, the variations in properties caused by the formation of the membrane are easily prevented or minimized.

In addition, in the method for manufacturing a piezoelectric device according to a preferred embodiment of the present invention, a planarization step of planarizing the surface of the support layer at a support base material side is preferably performed.

In this manufacturing method, since the support layer is bonded after the planarization treatment, a bonding strength between the support layer and the support base material is improved, and thus, a highly reliable piezoelectric device is manufactured.

In addition, in the method for manufacturing a piezoelectric device according to a preferred embodiment of the present invention, the sacrificial layer is preferably formed from a material which is easily removed as compared to that of each of the piezoelectric substrate and the support member.

In this manufacturing method, although the sacrificial layer is formed in a space between the support member and the piezoelectric substrate and is in contact with the support member and the piezoelectric substrate, an adverse influence imparted on the support member and the piezoelectric substrate is reduced, and only the sacrificial layer can be easily and reliably removed.

In addition, in the method for manufacturing a piezoelectric device according to a preferred embodiment of the present invention, an electrode formation step of forming an electrode for functioning as a device on the surface of the piezoelectric substrate at the ion implantation layer side is preferably performed between the ion implantation step and the sacrificial layer formation step.

In this manufacturing method, a case in which the formation steps described above are applied to a piezoelectric device having an electrode at a hollow side of the membrane is described, and even with a piezoelectric device having the structure as described above, a stress is effectively prevented from being applied to a piezoelectric film in manufacturing.

In addition, in the method for manufacturing a piezoelectric device according to a preferred embodiment of the present invention, the sacrificial layer is preferably formed from a material which is easily removed as compared to that of each of the piezoelectric substrate, the support member, and the electrode.

In this manufacturing method, although the sacrificial layer is formed in a space between the support member and the piezoelectric substrate and is in contact with the support member, the piezoelectric substrate, and the electrode, an adverse influence imparted to the support member, the piezoelectric substrate, and the electrode can be effectively reduced, and only the sacrificial layer can be easily and reliably removed.

In addition, in the method for manufacturing a piezoelectric device according to a preferred embodiment of the present invention, a reinforcing layer formation step of forming a piezoelectric thin film reinforcing layer on the surface of the piezoelectric substrate at the ion implantation layer side is preferably performed between the ion implantation step and the sacrificial layer formation step.

In this manufacturing method, a case in which the formation steps described above are applied to a piezoelectric device including a piezoelectric thin film reinforcing layer at a hollow side of the membrane is described, and even with a piezoelectric device having the structure as described above, a stress is effectively prevented from being applied to a piezoelectric film during manufacturing. Furthermore, since the piezoelectric thin film reinforcing layer is used, in a heat treatment in the manufacturing process, a material of the sacrificial layer is also be prevented from diffusing in the piezoelectric thin film.

In addition, in this method for manufacturing a piezoelectric device according to a preferred embodiment of the present invention, the sacrificial layer is preferably formed from a material which is easily removed as compared to that of the piezoelectric thin film reinforcing layer.

In this manufacturing method, although the sacrificial layer is formed in a space between the support member and the piezoelectric thin film reinforcing layer and is in contact with the support member and the piezoelectric thin film reinforcing layer, an adverse influence imparted to the support member and the piezoelectric thin film reinforcing layer is effectively reduced, and only the sacrificial layer can be easily and reliably removed.

According to various preferred embodiments of the present invention, when a piezoelectric device having a membrane structure is manufactured, the generation of a stress locally applied to a functional portion of the piezoelectric device is reliably prevented by a relatively simple method. Accordingly, crystalline destruction generated in the functional portion is effectively prevented, and the degradation in properties of the piezoelectric device manufactured by this manufacturing method is also prevented.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 2A to 2E include schematic views each showing a step of manufacturing the piezoelectric device formed by the manufacturing flow shown in FIG. 1.

FIGS. 3A to 3D include schematic views each showing a step of manufacturing the piezoelectric device formed by the manufacturing flow shown in FIG. 1.

DETAILED DESCRIPTION OF THE PREFERRED EMBODIMENTS

A method for manufacturing a piezoelectric device according to a first preferred embodiment of the present invention will be described with reference to the drawings. In the following description, as the piezoelectric device, a thin film piezoelectric device for F-BAR using a piezoelectric thin film will be described as an example.

Figure 1:
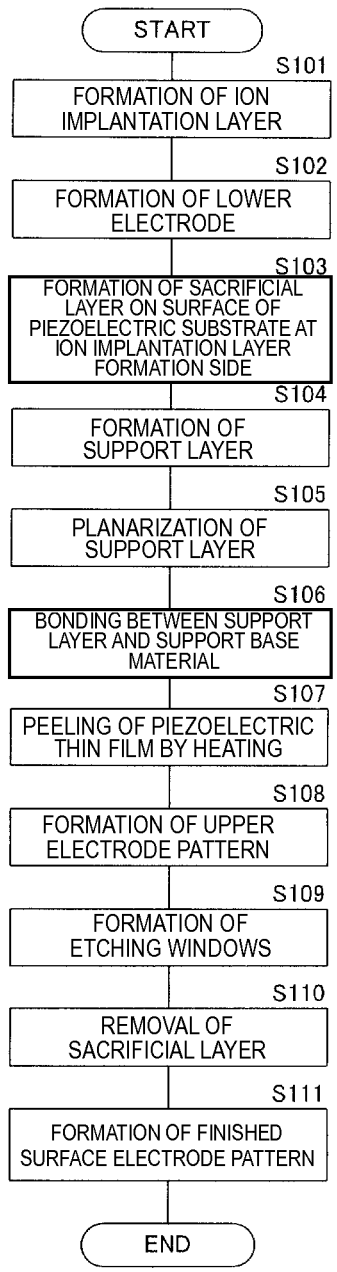
FIG. 1 is a flowchart showing a method for manufacturing a piezoelectric device according to a first embodiment of the present invention.

FIG. 1 is a flowchart showing a method for manufacturing a piezoelectric device according to this preferred embodiment of the present invention.

FIGS. 2A to 4B include schematic views each showing a step of manufacturing the piezoelectric device formed by the manufacturing flow shown in FIG. 1.

A piezoelectric single crystal substrate 1 having a predetermined thickness is prepared, and as shown in FIG. 2A, an ion implantation layer 100 is preferably formed by implanting hydrogen ions from a rear surface 12 side (FIG. 1: S101). In this step, as the piezoelectric single crystal substrate 1, a mother substrate in which a plurality of thin film piezoelectric devices is arranged is preferably used. In addition, for example, when an LT substrate is used as the piezoelectric single crystal substrate 1, preferably by performing implantation of hydrogen ions at a dose of about $1.0 \times 10^{17}$ atom/cm$^2$, for example, and an accelerating energy of about 150 KeV, for example, a hydrogen ion layer is preferably formed at a depth of approximately 1 μm, for example from the rear surface 12, so that an ion implantation layer 100 is formed. In addition, as the piezoelectric single crystal substrate 1, besides the LT substrate, an LN substrate, an LBO ($Li_2B_4O_7$) substrate, a langasite ($La_3Ga_5SiO_{14}$) substrate, a KN ($KNbO_3$) substrate, and a KLN ($K_3Li_2Nb_5O_{15}$) substrate, for example, may also be used, and ion implantation is performed under the appropriate conditions for each substrate.

Next, as shown in FIG. 2B, a lower electrode 20 and a lead electrode (not shown) to drive the F-BAR device are preferably formed using aluminum (Al) or other suitable material, for example, to have a predetermined thickness on the rear surface 12 of the piezoelectric single crystal substrate 1 (FIG. 1: S102). In addition, for the lower electrode 20, besides Al, single elements, such as W, Mo, Ta, Hf, Cu, Pt, and Ti, for example, may be used alone or in combination in accordance with the specification of the device, and Cu, for example, may also be used for the lead electrode.

Next, as shown in FIG. 2C, a sacrificial layer 30 is preferably formed on the rear surface 12 of the piezoelectric single crystal substrate 1 at an ion implantation layer 100 side (FIG. 1: S103). The sacrificial layer 30 is preferably made of a material which can be etched at a different etching rate from that of the lower electrode 20 by selecting an etching gas or an etching solution, and this material is easily etched as compared to that of the lower electrode 20. In addition, the sacrificial layer 30 is preferably made of a material which is easily etched as compared to that of a support layer 40 which will be described later and that of the piezoelectric single crystal substrate 1. Furthermore, the sacrificial layer 30 is more preferably made of a material having excellent electromigration resistance. In particular, in accordance with the conditions, the material of the sacrificial layer 30 is appropriately selected, for example, from the group consisting of metals, such as Ni, Cu, and Al, insulating films of $SiO_2$, ZnO, and phosphosilicate glass (PSG), and organic films. The sacrificial layer 30 is preferably formed by lamination using vacuum deposition, sputtering, CVD, or other suitable method, or is formed by spin coating or other suitable method, for example, and is preferably formed in a predetermined region at least including a functional portion of the F-BAR device, that is, the lower electrode 20.

Next, as shown in FIG. 2D, the support layer 40 is preferably formed on the rear surface 12 of the piezoelectric single crystal substrate 1 on which the sacrificial layer 30 is formed (FIG. 1: S104). The support layer 40 is preferably made of an insulating material, and as this insulating material, a material is preferable which includes an inorganic substance, such as a silicon oxide, a silicon nitride, an aluminum oxide, or PSG, or an organic substance, such as a resin, for example, and which has a strong resistance against an etching gas and an etching solution used for removal of the sacrificial layer 30. In addition, the material of the support layer 40 is preferably selected in consideration of the coefficient of linear expansion with respect to that of the piezoelectric single crystal substrate 1 and that of the sacrificial layer 30. The support layer 40 is also preferably formed by lamination using vacuum deposition, sputtering, CVD, or other suitable method or is formed by spin coating or other suitable method, and is formed on the entire or substantially the entire rear surface 12 so as to have a predetermined thickness.

Next, as shown in FIG. 2E, a planarization treatment, such as CMP, for example, is preferably performed on the surface of the support layer 40 (FIG. 1: S105). In this step, as shown in FIG. 2E, since the properties of the piezoelectric device are not adversely influenced as long as the sacrificial layer 30 is not exposed, it is not necessary to set a strict polishing amount, and the polishing amount may be appropriately determined. Accordingly, the number of restrictions on the polishing step is significantly reduced, and thus, the polishing step can be easily performed. In addition, an adverse influence to the properties caused by this polishing is also prevented.

Next, as shown in FIG. 3A, the support layer 40 and a support base material 50 are bonded to each other (FIG. 1: S106). A portion including the support layer 40 and the support base material 50 corresponds to a "support member" in this preferred embodiment of the present invention. As the support base material 50, for example, Si or a ceramic, such as alumina or glass, may preferably be used. In addition, for this bonding, direct bonding by activated bonding is preferably used. Activated bonding is a bonding method in which bonding is performed using a bonding plane in an activated state by irradiation with Ar ions in a vacuum, and this method requires no heating. By using this method, since a heat treatment for eliminating hydrogen is not required after bonding, unlike the case of hydrophilic bonding, the degradation in properties of the piezoelectric device caused by heating and the generation of stress caused by difference in the coefficients of linear expansion between the support layer 40 and the support base material 50 are prevented.

Next, as shown in FIG. 3B, the piezoelectric single crystal substrate 1 is preferably heated, so that peeling is performed using the ion implantation layer 100 as a stripped plane (FIG. 1: S107). Accordingly, a piezoelectric thin film 10 supported by the support member including the sacrificial layer is formed. In this step, the heating temperature can be decreased if heating is performed in a reduced-pressure atmosphere. Subsequently, a surface 13 of the piezoelectric thin film 10 formed by peeling as described above is polished, for example, by a CMP treatment for planarization.

Next, as shown in FIG. 3C, an upper electrode pattern including an upper electrode 60 and bump pads 61 for driving the F-BAR device is preferably formed on the surface 13 of the piezoelectric thin film 10 (FIG. 1: S108).

Next, as shown in FIG. 3D, etching windows 71 for removing the sacrificial layer 30 are preferably formed in the surface 13 of the piezoelectric thin film 10 on which an upper electrode pattern is formed (FIG. 1: S109).

Figure 4A:
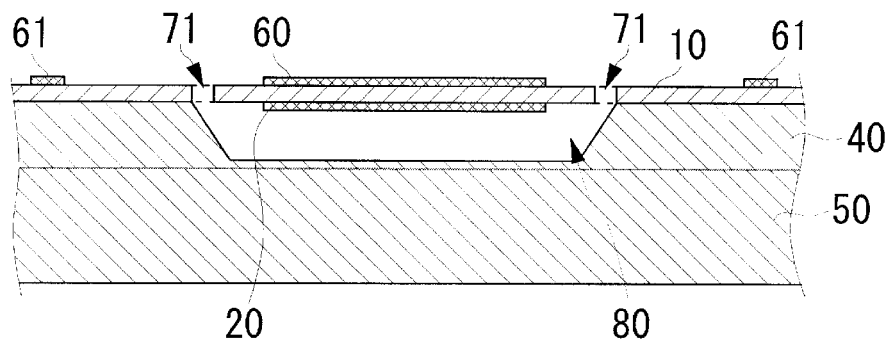
FIGS. 4A and 4B include schematic views each showing a step of manufacturing the piezoelectric device formed by the manufacturing flow shown in FIG. 1.

Next, the sacrificial layer 30 is removed preferably by supplying an etching gas or an etching solution via the etching windows 71. Accordingly, a space in which the sacrificial layer 30 is formed corresponding to a region in which the lower electrode 20 and the upper electrode 60 of the piezoelectric device are formed becomes a depletion layer 80 as shown in FIG. 4A (FIG. 1: S110).

Figure 4B:
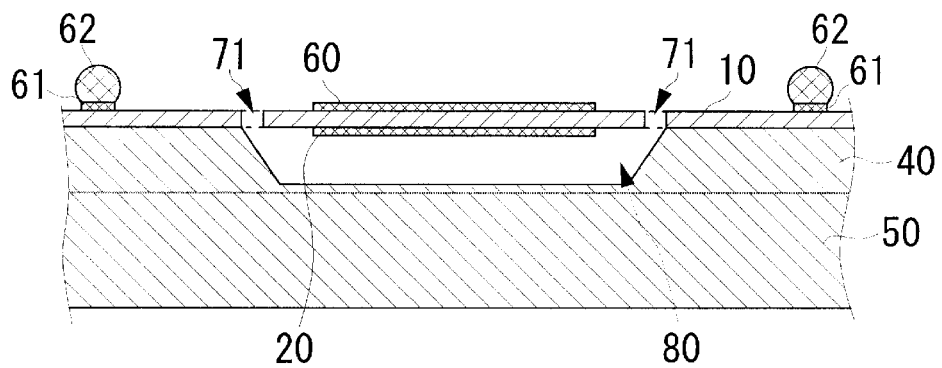

Next, as shown in FIG. 4B, for example, bumps 62 are preferably formed on the bump pads 61, so that a finish surface electrode pattern is formed (FIG. 1: S111). As described above, the piezoelectric device is formed.

By using the manufacturing method described above, since the sacrificial layer 30 and the support layer 40 are directly formed on the rear surface 12 of the piezoelectric single crystal substrate 1, the sacrificial layer 30 and the support layer 40 can be arranged on the rear surface 12 of the piezoelectric single crystal substrate 1 without using a bonding treatment.

Accordingly, even when irregularities are present after a planarization treatment of the bonding plane of the support member, since the membrane portion used as the piezoelectric functional portion is protected by the sacrificial layer, no piezoelectric crystal destruction caused by a local and large stress generated from a projection portion of the support member occurs. Thus, the degradation in properties of the piezoelectric device manufactured by the manufacturing method described above is effectively prevented.

In addition, as described above, since a method is used in which the support layer 40 is formed so as to cover the sacrificial layer 30, and after being polished, the support layer 40 is bonded to the support base material 50, a hollow region of the membrane defined by the depletion layer 80 can be uniformly formed when the formation accuracy of the sacrificial layer 30 is improved, and as a result, the variations in properties of the piezoelectric device are easily prevented or minimized.

Next, a method for manufacturing a piezoelectric device according to a second preferred embodiment of the present invention will be described with reference to the drawings.

Figure 5:
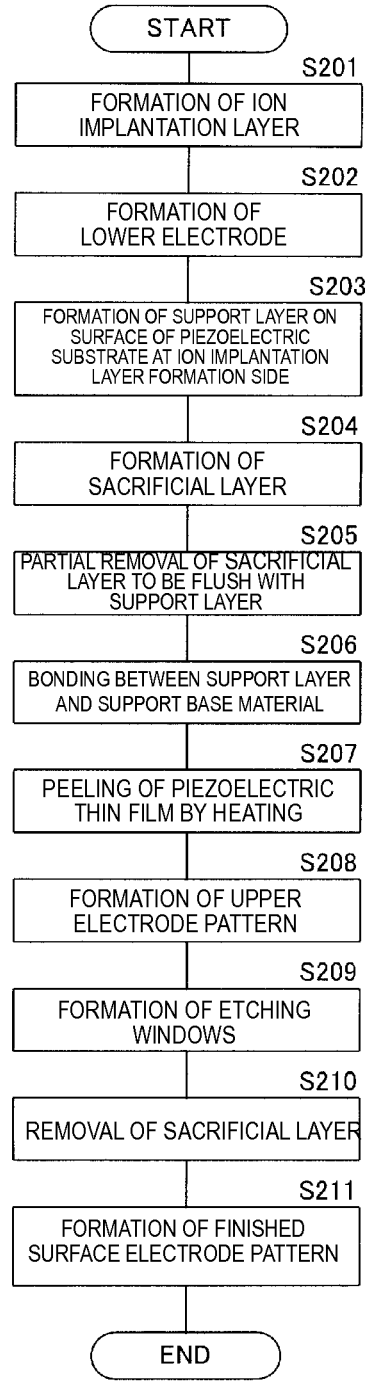
FIG. 5 is a flowchart showing a method for manufacturing a piezoelectric device according to a second preferred embodiment of the present invention.

FIG. 5 is a flowchart showing a method for manufacturing a thin film piezoelectric device according to this preferred embodiment.

FIGS. 6A to 6D include schematic views showing only characteristic steps of manufacturing the piezoelectric device formed by the manufacturing flow shown in this preferred embodiment.

Since the differences between the method for manufacturing a piezoelectric device according to this preferred embodiment and the method for manufacturing a piezoelectric device described in the first preferred embodiment are the steps of forming the sacrificial layer 30 and the support layer 40 and the step of bonding the support base material 50, S203 to S206 shown in FIG. 5 corresponding to the above steps will only be described. Since S201, S202, and S207 to S211 are respectively the same or substantially the same as S101, S102, and S107 to S111, which are described in the first preferred embodiment, description thereof will be omitted.

Figure 6A:
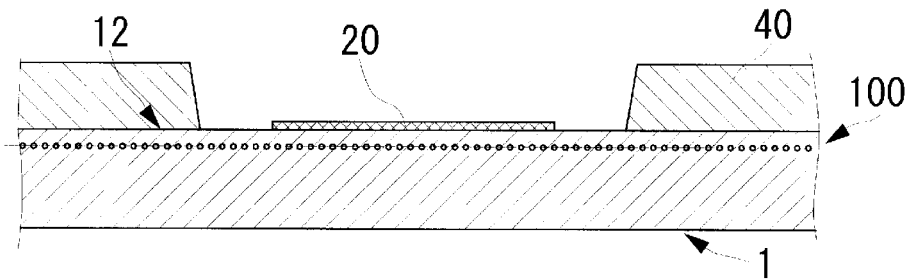
FIGS. 6A to 6D include schematic views showing only characteristic steps of manufacturing the piezoelectric device formed by the manufacturing flow shown in FIG. 5.

On the rear surface 12 of the piezoelectric single crystal substrate 1 on which the lower electrode 20 and the lead electrode (not shown) are formed, as shown in FIG. 6A, the support layer 40 is preferably formed (FIG. 5: S203). In this step, the support layer 40 is preferably formed in a region other than the region in which the sacrificial layer 30 is to be formed in the following step. Furthermore, the height of the support layer 40 is determined in accordance with the depth of the depletion layer 80 which forms a hollow region of the membrane. In addition, a material of the support layer 40 and a manufacturing method thereof are preferably the same or substantially the same as those in the first preferred embodiment.

Figure 6B:
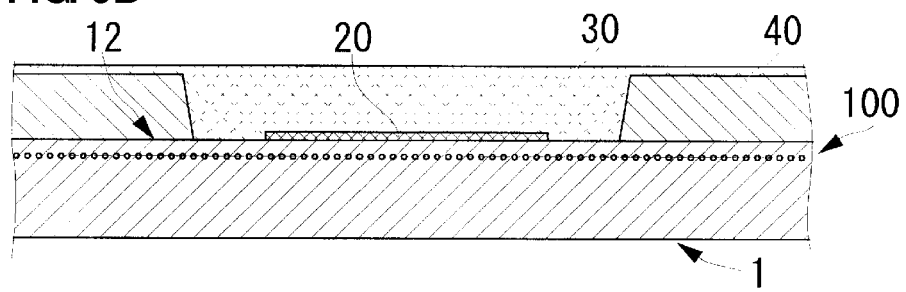

Next, as shown in FIG. 6B, the sacrificial layer 30 is preferably formed so as to cover the rear surface 12 of the piezoelectric single crystal substrate 1 and the surface of the support layer 40 (FIG. 5: S204). A material of the sacrificial layer 30 and a manufacturing method thereof are also the same or substantially the same as those in the first preferred embodiment.

Figure 6C:
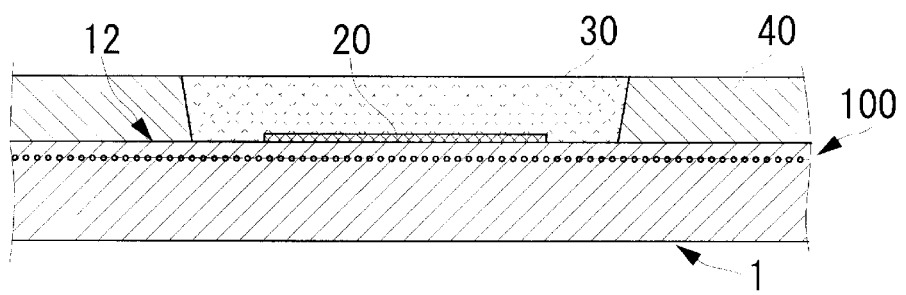

Next, as shown in FIG. 6C, the sacrificial layer 30 is preferably removed until the surface of the support layer 40 is exposed (FIG. 5: S205). For the removal of the sacrificial layer 30, any method which can selectively remove only the sacrificial layer 30 without removing the support layer 40, such as etching or polishing, for example, may be appropriately used.

Figure 6D:
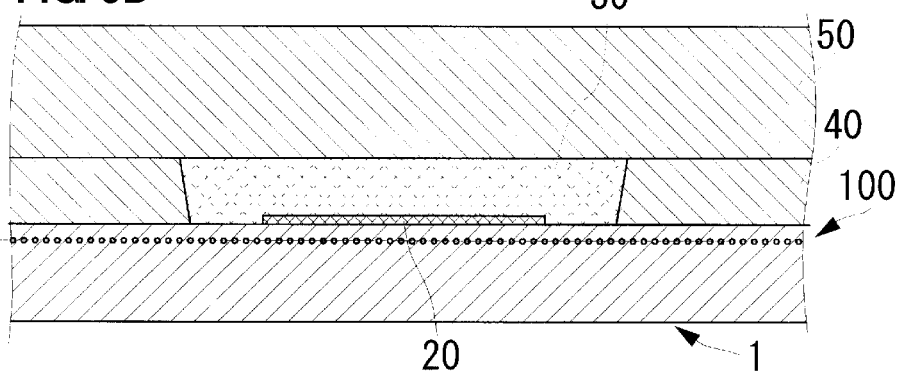

Next, as shown in FIG. 6D, the surface of the support layer 40 and the support base material 50 are preferably bonded to each other. This bonding method is also the same or substantially the same as that of the first preferred embodiment (FIG. 5: S206).

By using the manufacturing method as described above, the depletion layer 80 which becomes the membrane can be formed to have a stable and consistent shape. Accordingly, the variations in properties caused by forming the membrane are easily prevented or minimized.

Although in the preferred embodiments described above, the steps of forming the sacrificial layer 30 and the support layer 40 directly on the rear surface 12 of the piezoelectric single crystal substrate 1 on which the lower electrode 20 is formed and the structures thereof are described, a thin film reinforcing layer may also be arranged between the rear surface 12 of the piezoelectric single crystal substrate 1 and the lower electrode 20 and the sacrificial layer 30 and the support layer 40. In this step, as the thin film reinforcing layer, an insulating material, such as SiN, $SiO_2$, DLC, or $Ta_2O_5$, for example, may preferably be used. Although the thin film reinforcing layer is arranged as described above, as in the preferred embodiments described above, an operation effect of the steps of directly forming the sacrificial layer 30 and the support layer 40 without bonding is obtained. Furthermore, by using the thin film reinforcing layer, the sacrificial layer 30 is prevented from diffusing in the piezoelectric single crystal substrate 1 by a heat treatment and other such treatment in the manufacturing process, and thus, the degradation in properties of the piezoelectric device is prevented. In addition, in this case, another thin film reinforcing layer may also be arranged at a surface 13 side of the piezoelectric thin film 10, and with these thin film reinforcing layers, the strength of the membrane can be appropriately increased, and as a result, the generation of stress caused by an unnecessary strain or other force is prevented.

In addition, in the above-described preferred embodiments, although the piezoelectric device for F-BAR is described as an example, the manufacturing method according to preferred embodiments of the present invention may also be applied to other piezoelectric devices. In particular, the manufacturing method according to preferred embodiments of the present invention is effective for a Lamb wave device and a plate wave device, for example, in which the surface roughness, the thickness uniformity, the piezoelectricity, and the crystallinity of the membrane have significant influences on frequency properties. In addition, the manufacturing method according to preferred embodiments of the present invention is also effective for various devices, such as a pyroelectric sensor, a gyroscope, an RF switch, a magnetic sensor, and an oscillating power generation element, for example, which are each formed of a piezoelectric single crystal thin film and which each have a membrane.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method for manufacturing a piezoelectric device including a piezoelectric thin film and a support member supporting the piezoelectric thin film, comprising:
   an ion implantation step of forming an ion implantation layer by implanting ions into a piezoelectric substrate;
   a sacrificial layer formation step of forming a sacrificial layer on the surface of the piezoelectric substrate at an ion implantation layer side of the sacrificial layer;
   a support member formation step of forming the support member on the surface of the piezoelectric substrate at the ion implantation layer side;
   a peeling step of forming the piezoelectric thin film by peeling a portion of the piezoelectric substrate in which the ion implantation layer is formed; and
   a sacrificial layer removal step of removing the sacrificial layer.

2. The method for manufacturing a piezoelectric device according to claim 1, wherein the support member formation step is performed after the sacrificial layer formation step and includes:
   a support layer formation step of forming a support layer so as to cover the sacrificial layer; and
   a support base material bonding step of bonding a support base material to the support layer.

3. The method for manufacturing a piezoelectric device according to claim 2, further comprising a planarization step of performing a planarization treatment on the surface of the support layer at a side of the support base material.

4. The method for manufacturing a piezoelectric device according to claim 1, wherein the support member formation step includes:
   before the sacrificial layer formation step, a support layer formation step of forming a support layer in a region other than a region in which the sacrificial layer is to be formed; and
   after the sacrificial layer formation step, a support base material bonding step of bonding a support base material to the sacrificial layer and the support layer.

5. The method for manufacturing a piezoelectric device according to claim 1, wherein the sacrificial layer includes a material which is more easily removed as compared to materials of the piezoelectric substrate and the support member.

6. The method for manufacturing a piezoelectric device according to claim 1, further comprising, between the ion implantation step and the sacrificial layer formation step, an electrode formation step of forming an electrode on the surface of the piezoelectric substrate at the ion implantation layer side.

7. The method for manufacturing a piezoelectric device according to claim 6, wherein the sacrificial layer includes a material which is more easily removed as compared to materials of the piezoelectric substrate, the support member, and the electrode.

8. The method for manufacturing a piezoelectric device according to claim 1, further comprising, between the ion implantation step and the sacrificial layer formation step, a reinforcing layer formation step of forming a piezoelectric thin film reinforcing layer on the surface of the piezoelectric substrate at the ion implantation layer side.

9. The method for manufacturing a piezoelectric device according to claim 8, wherein the sacrificial layer includes a material which is more easily removed as compared to a material of the piezoelectric thin film reinforcing layer.

* * * * *